United States Patent [19]
Paniccia

[11] Patent Number: 5,895,972
[45] Date of Patent: Apr. 20, 1999

[54] METHOD AND APPARATUS FOR COOLING THE BACKSIDE OF A SEMICONDUCTOR DEVICE USING AN INFRARED TRANSPARENT HEAT SLUG

[75] Inventor: Mario J. Paniccia, Santa Clara, Calif.

[73] Assignee: Intel Corporation, Santa Clara, Calif.

[21] Appl. No.: 08/778,016

[22] Filed: Dec. 31, 1996

[51] Int. Cl.$^6$ .................... H01L 23/10; H01L 23/34; H01L 23/06

[52] U.S. Cl. .................... 257/706; 257/705; 257/796; 257/712; 257/778

[58] Field of Search .................... 257/706, 705, 257/675, 796, 712, 722, 777, 778; 361/709, 676

[56] References Cited

U.S. PATENT DOCUMENTS

| | | | |
|---|---|---|---|
| 3,990,100 | 11/1976 | Mamine et al. | 357/30 |
| 4,168,113 | 9/1979 | Chang et al. | 351/166 |
| 4,203,129 | 5/1980 | Oktay et al. | 257/697 |
| 4,529,685 | 7/1985 | Borodovsky | 430/311 |
| 4,582,954 | 4/1986 | Eaton et al. | 174/16 |
| 4,617,252 | 10/1986 | Cordes, III et al. | 430/272 |
| 4,649,992 | 3/1987 | Geen et al. | 165/185 |
| 5,004,307 | 4/1991 | Kino et al | 350/1.2 |
| 5,061,568 | 10/1991 | Kessel et al. | 428/437 |
| 5,070,040 | 12/1991 | Pankove | 437/209 |
| 5,106,786 | 4/1992 | Brady et al. | 437/229 |
| 5,146,314 | 9/1992 | Pankove | 357/82 |
| 5,243,458 | 9/1993 | Hatano et al. | 359/360 |
| 5,291,064 | 3/1994 | Kurokawa | 257/717 |
| 5,354,717 | 10/1994 | Pollock et al. | 437/225 |
| 5,376,587 | 12/1994 | Buchmann et al. | 437/209 |
| 5,418,019 | 5/1995 | Chen et al. | 427/579 |
| 5,500,540 | 3/1996 | Jewell et al. | 257/82 |
| 5,508,230 | 4/1996 | Anderson et al. | 437/183 |
| 5,610,442 | 3/1997 | Schneider et al. | 257/778 |
| 5,644,163 | 7/1997 | Tsuji | 257/705 |

FOREIGN PATENT DOCUMENTS

| | | | |
|---|---|---|---|
| 63-81956 | 4/1988 | Japan | 257/705 |
| 2-276264 | 11/1990 | Japan | 257/705 |

OTHER PUBLICATIONS

D.L. Barton, "Infrared Light Emission From Semiconductor Devices", *Proc. of 22nd Intl. Symp. for Testing and Failure Anal.*, pp. 9–17, vol. 18–22, Los Angeles, CA, Nov. 1996.

S. Hayashi, "Solid Immersion Lens for Optical Storage", *SPIE's Symp. on Electronic Imaging Science & Technology*, 8 pages, Report No. 5258, Feb. 1995.

*Primary Examiner*—Mahshid Saadat
*Assistant Examiner*—Jhihan B. Clark
*Attorney, Agent, or Firm*—Blakely, Sokoloff, Taylor & Zafman LLP

[57] ABSTRACT

An apparatus and method that permits the removal of heat from the back side surface of an integrated circuit semiconductor substrate while performing optical based testing through or at the back side surface of the semiconductor substrate.

In one embodiment, the present invention includes a semiconductor device having an infrared transparent heat slug attached to the back side surface of the device. Heat is removed from the semiconductor device through an infrared transparent heat slug that is then thermally cooled by a conventional cooling technique.

29 Claims, 11 Drawing Sheets

5,895,972

1

METHOD AND APPARATUS FOR COOLING THE BACKSIDE OF A SEMICONDUCTOR DEVICE USING AN INFRARED TRANSPARENT HEAT SLUG

FIELD OF THE INVENTION

The present invention relates to the cooling of a semiconductor device by the use of an infrared transparent heat slug that enhances the transfer of heat from the semiconductor device to a heat sink.

BACKGROUND OF THE INVENTION

Within the integrated circuit industry there is a continuing effort to increase integrated circuit speed as well as device density. As a result of these efforts, there is a trend towards using flip chip technology when packaging complex high speed integrated circuits. Flip chip technology is also known as control collapse chip connection (C4) technology. In C4 technology, the integrated circuit die is flipped upside down. This is opposite to how integrated circuits are packaged today using wire bond technology. By flipping the integrated circuit die upside down, ball bonds may be used to provide direct electrical connections from the bond pads of the die directly to a corresponding set of pads on a package.

In the following discussion reference will be made to a number of drawings. The drawings are provided for descriptive purposes only and are not drawn to scale.

FIG. 1 illustrates an integrated circuit die 102 that is housed in a cavity 105 of a PGA (Pin Grid Array) package 110. The integrated circuit die includes a semiconductor substrate 103 having a top surface 107 and a back side surface 108. The active regions 109 of the integrated circuit are formed from the top surface 107 of the of the semiconductor substrate 103. Wire bonds 104 are used to electrically connect integrated circuit connections in integrated circuit die 102 through internal metal interconnects to the pins 106 of package substrate 110. With the trend towards high speed integrated circuits, the inductance generated in the wire bonds 104 of the typical wire-bonded integrated circuit packaging becomes an increasingly significant problem.

FIG. 2 illustrates a C4 mounted integrated circuit die 202 that is electrically coupled to a PGA (Pin Grid Array) package 210 by ball bonds 204. Die 202 includes a semiconductor substrate 203 that has a top surface 208 and a back side surface 207. The active regions 209 of the integrated circuit are formed from the top surface 208 of the of the semiconductor substrate 203. Because the bond pads of integrated circuit device 202 are located on the top-side surface 208 of the device, the die must be flipped upside down so that it may be attached to package 210. In comparison with the wire bonds 104 of FIG. 1, the ball bonds 204 of integrated circuit device 202 provide more direct electrical connections between the integrated circuit device 202 and the pins 206 of package substrate 210. As a result, the inductance problems associated with typical integrated circuit wire bond packaging technologies are minimized. Unlike wire bond technology, which only allows bonding along the periphery of the integrated circuit die, C4 technology allows connections to be placed anywhere on the integrated circuit die surface. This leads to a much cleaner and more efficient power distribution to the integrated circuit which is another major advantage of C4 technology.

During the silicon debug phase of a new product it is often necessary to probe certain internal portions of the integrated circuit in order to obtain important electrical data from the integrated circuit. Important data include measuring device

2 parameters such as, but are not limited to, voltage levels, timing information, current levels and thermal information. Emissions from the backside of the die may also be measured to determine or locate a variety of defects, such as impact ionization, shorts, hot carrier effects, forward and reverse bias P-N junctions, transistors in saturation and gate oxide breakdown.

Present day debug process for wire bond technology is based on directly probing the metal interconnects on the chip front side with an electron beam (E-beam) or mechanical prober. Typical integrated circuit devices have multiple layers of metal interconnects and it is often difficult to access nodes that are buried deep in the chip. Usually other tools such as plasma etchers and focused ion beam systems must be used to mill away the dielectric and or metal above the node to expose metal nodes for probing. With C4 packaging technology, however, this front side methodology is not feasible since the integrated circuit die is flipped upside down making these internal metal nodes inaccessible.

In order to test and debug C4 mounted integrated circuit devices a number of optical-based testing methods, such as laser probing, have been developed that permit probing of internal portions of an integrated circuit through the back side of the C4 mounted devices. Since the active regions of the integrated circuit are located near the back side surface of the device, it is easier to access these regions through the silicon substrate for the purposes of laser or optical probing and/or for detecting photon emissions emitted from active devices. Since it is often difficult to access the active regions of an integrated circuit from the top surface of a wire-bonded integrated circuit device, it may be desirable to laser probe or detect photon emissions from the back side of a wire-bonded integrated circuit device. As such, the testing of internal nodes may be simplified with the use of an optical-based back side testing methodology. In such an instance, a portion of the package housing the integrated circuit must first be removed to expose the back side surface of the die's semiconductor substrate. Then optical based probing can be performed through the removed portion of the package housing.

During the testing or debugging of an integrated circuit device, it is generally desirable to operate the integrated circuit at its full operating capacity. Since the power density in modern microprocessors is typically very high, it is extremely important to remove heat created by the devices in order for the devices to maintain acceptable operating temperatures. If the temperature of the integrated circuit is not properly controlled, the performance of the circuit may be affected. In some instances, component degradation will occur if the temperature of the integrated circuit is not properly regulated. Thus, any information collected must be obtained with the device operating in its native packaged environment and with its temperature properly regulated. Otherwise, any information obtained may be useless.

FIG. 3A illustrates a prior art approach to dissipating heat from a C4 mounted semiconductor device. Heat is removed from the back side surface 207 of semiconductor device 202 by passing an air flow 240 over a finned heat sink 230 that is thermally coupled to back side surface 207. In some high power applications, heat is dissipated from semiconductor device 202 by attaching a thermally conductive heat slug 232 (e.g., a copper plate) to back side surface 207 and thermally coupling the heat slug to a heat sink. (See FIG. 3B.) In some instances, heat slug 232 is thermally coupled to a metal plate having a large thermal mass and a large heat transfer area. In other instances, heat slug 232 may be thermally coupled to a heat spreading plate by a heat pipe or some other low resistance thermal path.

As depicted in FIG. 4A, the removal of heat from a wire bonded semiconductor device 102 generally involves attaching a finned heat sink 130 to the bottom surface 112 of package 110 and passing an air flow 140 over the heat sink. A heat flow path is established across the back side surface 114 of semiconductor device 102 through package 110 and into heat sink 130. A heat slug (now shown) embedded within package 110 thermally couples die 102 to heat sink 130. Heat is carried away by the air flow 140 passing across finned heat sink 130. In high power applications, a heat slug 130 may be attached to the bottom surface 112 of package 110 and then thermally coupled to a heat spreading plate or other heat sink. (See FIG. 4B.) In the heat removal apparatus of FIGS. 4A and 4B, it is assumed that package 110 is made of a thermally conductive material such as a those typically used in standard ceramic packaging for integrated circuits. Although the prior art heat removal methods described above have proved sufficient in the past, they cannot be used in conjunction with testing methods that require probing through the back side of the semiconductor substrate. In other words, the prior art heat removal methods cannot be used in conjunction with any testing method or process that requires optical access to or through the back side of a semiconductor substrate.

Therefore, what is needed is a method and an apparatus for removing heat from the back side surface of an integrated circuit semiconductor substrate while simultaneously allowing the back side surface of the semiconductor to be probed, or otherwise tested in accordance with an optical-based testing technique.

SUMMARY OF THE INVENTION

An apparatus and method that permits the removal of heat from the back side surface of an integrated circuit semiconductor substrate while performing optical based testing through or at the back side surface of the semiconductor substrate is described.

In one embodiment, the present invention includes a semiconductor device having an infrared transparent heat slug attached to the back side surface of the device. Heat is removed from the semiconductor device through an infrared transparent heat slug that is then thermally cooled by a standard cooling technique.

BRIEF DESCRIPTION OF THE DRAWINGS

The present invention is illustrated by way of example and is not limited by the figures of the accompanying drawings, in which like references indicate similar elements, and in which.

DETAILED DESCRIPTION

An apparatus and method for removing heat from the backside of a semiconductor device is described. In the following description, numerous specific details are set forth such as material types, dimensions, processing steps, etc., in order to provide a thorough understanding of the present invention. However, it will be obvious to one of skill in the art that the invention may be practiced without these specific details. In other instances, well known elements and processing techniques have not been shown in particular detail in order to avoid unnecessarily obscuring the present invention. This discussion will mainly be limited to those needs associated with removing heat from semiconductor devices that are either wire bonded or C4 mounted to a PGA (Pin Grid Array) type package. It will be recognized, however, that such focus is for descriptive purposes only and that the apparatus and methods of the present invention are applicable to other electronic devices and other forms of packaging.

As explained earlier, optical-based testing and debugging techniques, such as laser based probing and photon emission detection, are particularly useful for evaluating integrated circuit parameters and defects through the back side surface of the semiconductor substrate. Since the semiconductor substrate is typically made of silicon which has a band gap energy of 1.1 eV, the energy of the photon used to probe the back side surface of the silicon should have an energy that is less than or equal to 1.1 eV (since photons with energies of less than the band gap will be partially transparent to the silicon). As such, photons are permitted to reach active regions located on top of the semiconductor substrate. For this reason, probing through the back side of a semiconductor device must be focused in the infrared region of the light spectrum.

Figure 1:
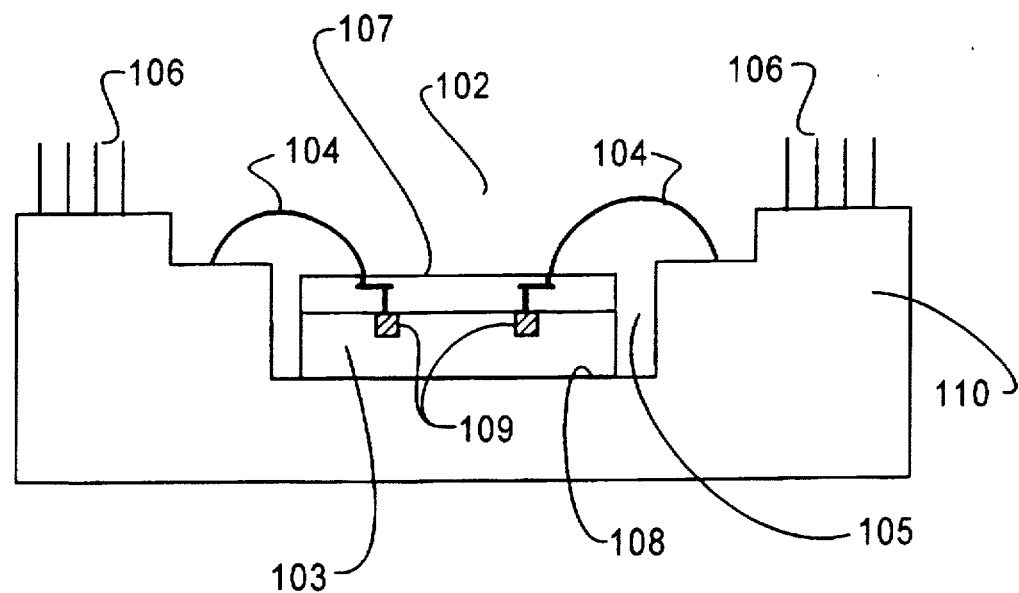
FIG. 1 illustrates a semiconductor device that is wire bonded to a package using standard wire bond technology.
Figure 2:
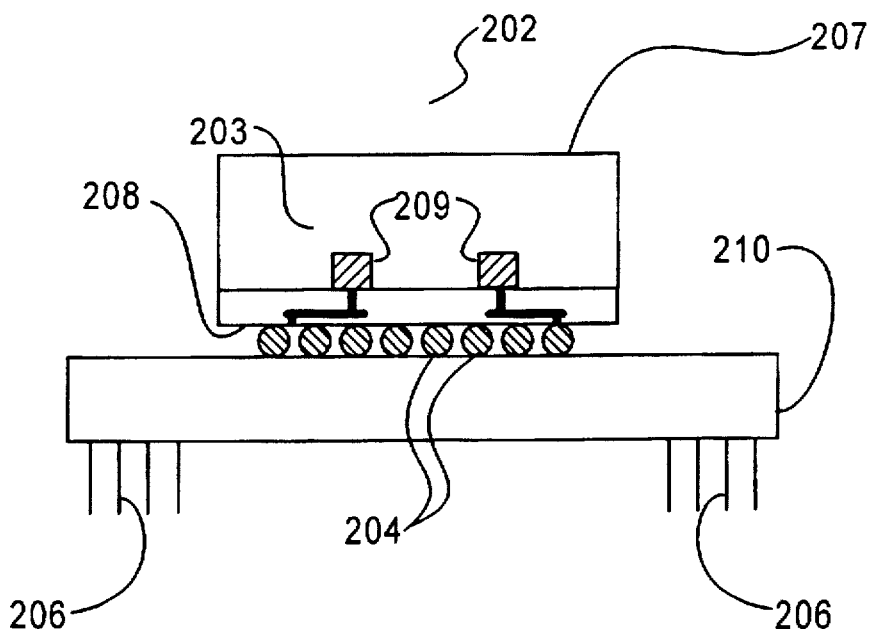
FIG. 2 illustrates a semiconductor device that is mounted to a package using flip chip or C4 packaging technology.
Figure 3A:
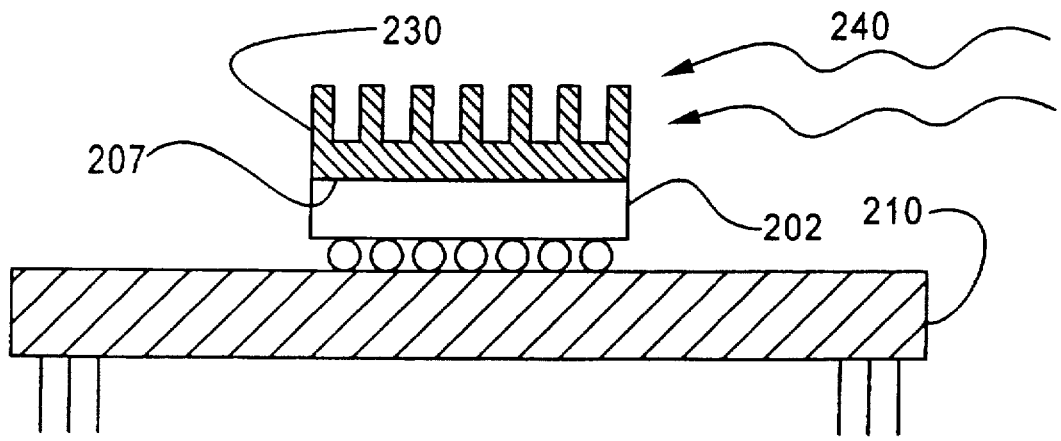
FIG. 3A illustrates the semiconductor device of FIG. 2 having a finned heat sink attached to the back side of the semiconductor substrate.
Figure 3B:
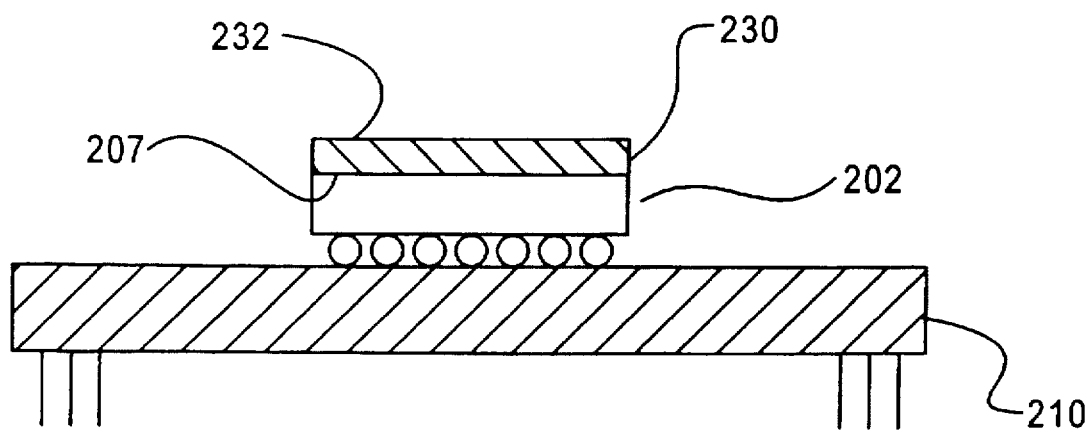
FIG. 3B illustrates the semiconductor device of FIG. 2 having a heat slug attached to the back side of the semiconductor substrate.
Figure 4A:
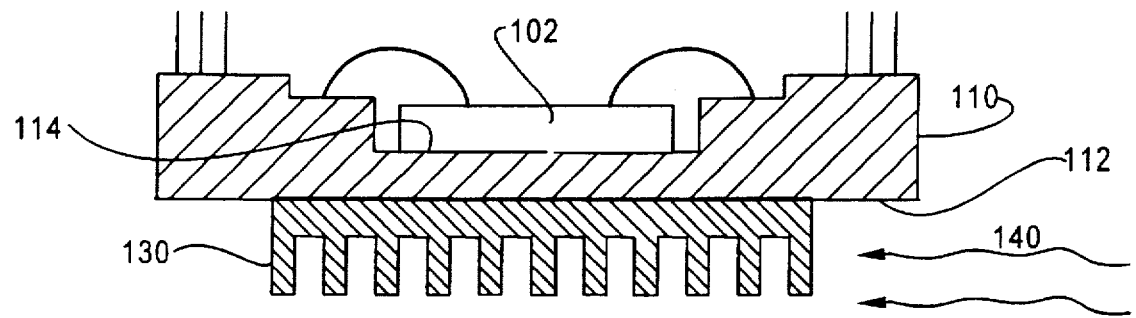
FIG. 4A illustrates the semiconductor device of FIG. 1 having a finned heat sink attached to the back side of the semiconductor package.
Figure 4B:
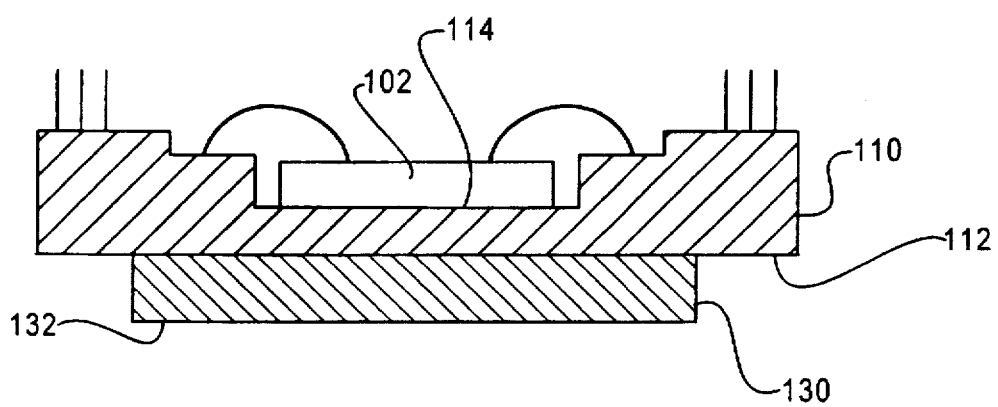
FIG. 4B illustrates the semiconductor device of FIG. 1 having a heat slug attached to the back side of the semiconductor package.
Figure 5A:
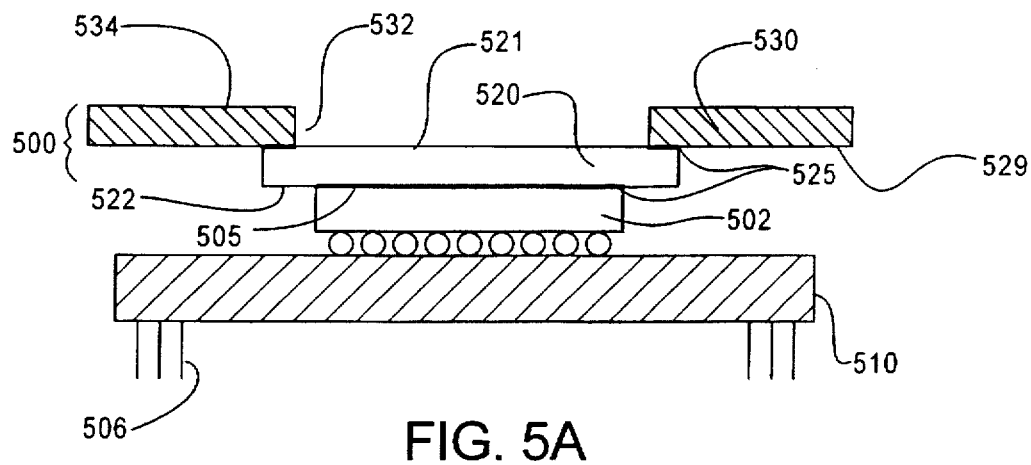
FIG. 5A illustrates a heat removal apparatus in accordance with one embodiment of the present invention.

FIG. 5A illustrates a side view of a heat removal apparatus 500 in one embodiment of the present invention. As illustrated in FIG. 5A, a semiconductor device 502 containing an integrated circuit is C4 mounted to a PGA package 510. An infrared transparent heat slug 520 having a top surface 521 and a bottom surface 522 is disposed over the back side surface 505 of semiconductor device 502. A heat sink 530 is thermally coupled to the outer edges of the heat slug's top surface 521. A heat transfer medium 525, such as a thermal grease or oil, may be used at the heat slug 520 and heat sink 530 thermal interface and at the heat slug 520 and semiconductor device 502 thermal interface to reduce the thermal resistance at these interfaces. The thermal medium must be transparent to infrared light. If the contact area between heat slug 520 and devices 530 and 502 is large, the use of a heat transfer medium at the interfaces may not be required. In order to maximize the contact area between heat slug 520 and devices 530 and 502, the component surfaces 505, 521, 522 and 529 may be lapped or polished to provide a mirror like finish on each of the surfaces.

Figure 5B:
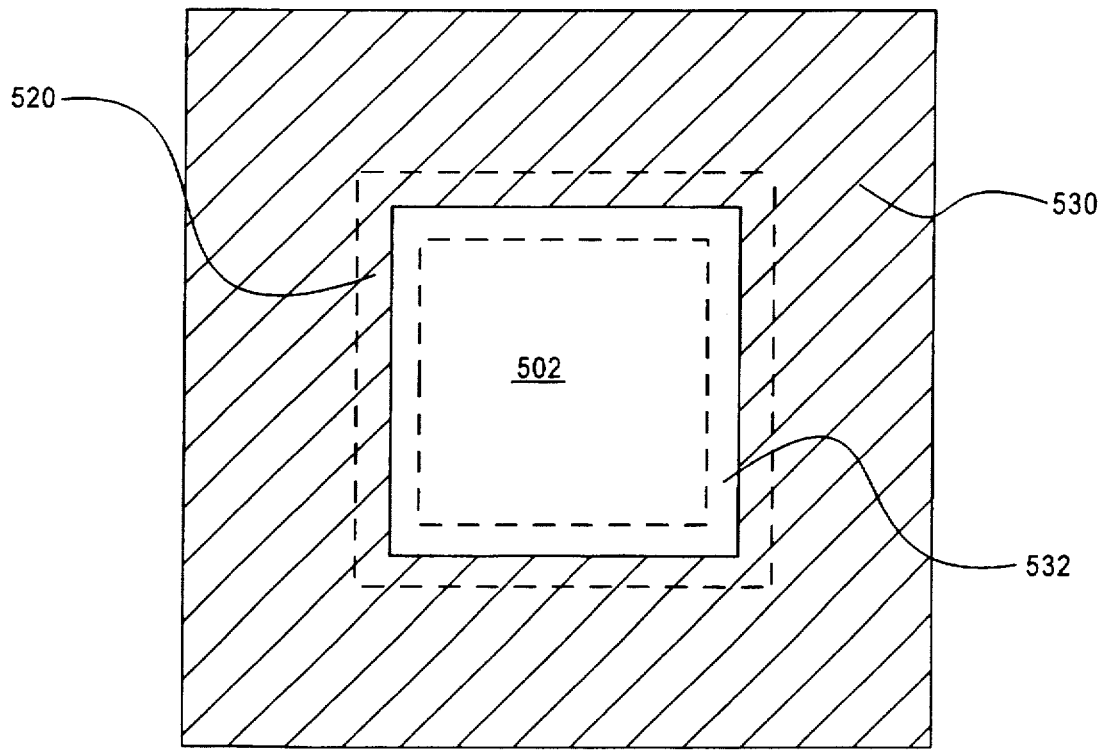
FIG. 5B illustrates a top view of the heat removal apparatus shown in FIG. 5A.

In one embodiment, heat sink 530 comprises a metal plate having a large thermal mass and a large heat transfer area. A through opening 532 is provided within heat sink 530 to expose a substantial portion of the heat slug's top surface 521. In this manner, infrared light may pass freely between an optical-based testing apparatus disposed above surface 521 and the back side surface 505 of device 502. FIG. 5B illustrates a top view of the cooling apparatus shown in FIG. 5A. A salient feature of the present invention lies in the use of infrared transparent heat slug 520 that both facilitates the removal of heat from the back side surface 505 of device 502 and permits the transmission of photons into and out of the back side surface 505.

Heat slug 520 is made of a material that is both a conductor of heat and transparent to infrared light. In one embodiment, heat slug 520 is made of diamond since diamond is both an excellent conductor of heat and is transparent to infrared light. Since diamond has a thermal conductivity that is approximately twelve times larger than silicon, it provides an excellent means for pulling heat out from the back side silicon surface 521 and out to the edges of the heat slug 520. Note, however, that the type of heat slug material used may vary depending upon the heat removal requirements of a particular application. When removing heat from a low heat dissipating device, the infrared transparent heat slug material may be made of a material having a lower thermal conductivity than diamond, such as sapphire, silicon, germanium and/or gallium arsenide.

As noted earlier, in one embodiment heat sink 530 may include a metal plate (e.g., copper or aluminum). When the semiconductor device 502 is operated in an ambient environment, heat may also be removed from heat sink 530 by passing an air flow over its top surface 534. The semiconductor device may also be cooled by directing cooled nitrogen, cooled dry air or cooled helium over the top surface 521 of heat slug 520. In instances when the semiconductor device 502 is being operated in a vacuum chamber, cooling coils may be integrally formed within heat sink 530 or attached to top surface 534. In other instances, heat sink 530 may comprise a heat pipe or other low resistance thermal path that couples heat slug 520 to a heat spreading plate or other heat sink that is located external to the packaged device.

Figure 6:
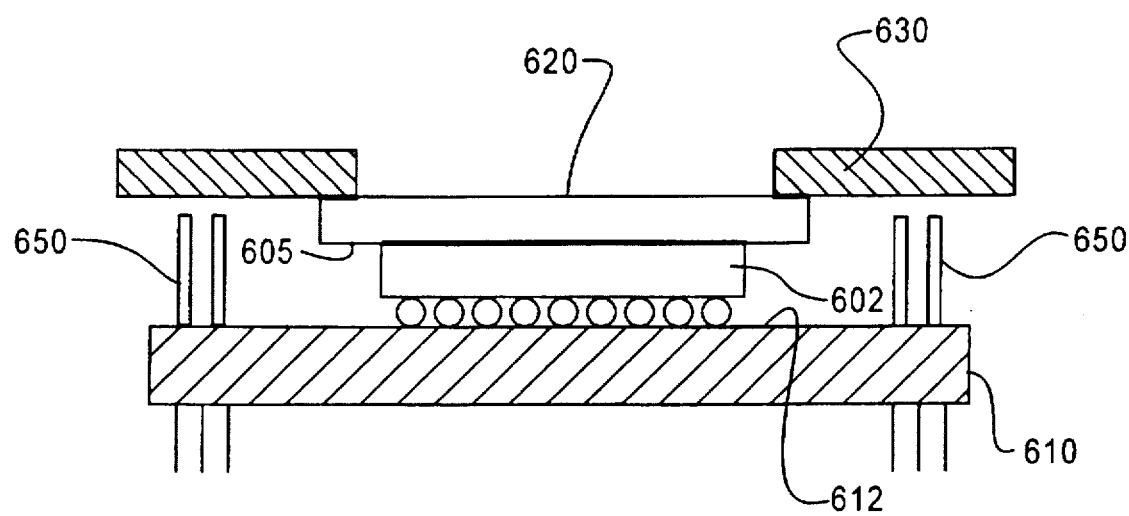
FIG. 6 illustrates an apparatus for cooling a semiconductor device that is mounted to the surface of a package substrate having other elements that are attached thereto.

In addition to housing an integrated circuit device, a semiconductor package often serves as a platform for mounting other electronic or electrical devices necessary for the proper operation of the integrated circuit device. For example, in order to control ringing caused by noise, or to enhance power distribution, and a host of other electrical problems, decoupling capacitors are often mounted onto the package substrate where they are then electrically coupled to the integrated circuit device. FIG. 6 illustrates a PGA package 610 having an integrated circuit device 602 and an array of Low Inductance Capacitor Arrays (LICAs) 650 mounted onto the top surface 612 of the package substrate. As illustrated, the height of capacitors 650 is typically greater than the height of integrated circuit device 602. As such, a problem arises when testing of the integrated circuit requires that the test apparatus be place in close proximity to the back side surface 605 of device 602. For example, the use of a solid immersion optical microscope requires that the lens of the microscope be placed in direct optical contact with the silicon back side of the integrated circuit device. Since the lens of the microscope is relatively large in size, the existence of the surface mounted capacitors 650 will either limit the available die area that may be scanned, or prevent the use of the microscope altogether. In most instances, the silicon substrate must be thinned prior to probing the semiconductor device in order to increase the transmission of infrared light. Thinning of the silicon substrate lowers the height of the semiconductor device relative to the LICA's. These problems are overcome by the present invention since the thickness of the infrared transparent heat slug 620 may be adjusted such that the combined height of integrated circuit device 602 and heat slug 620 is greater than the height of capacitors 650 as shown in FIG. 6.

Figure 7A:
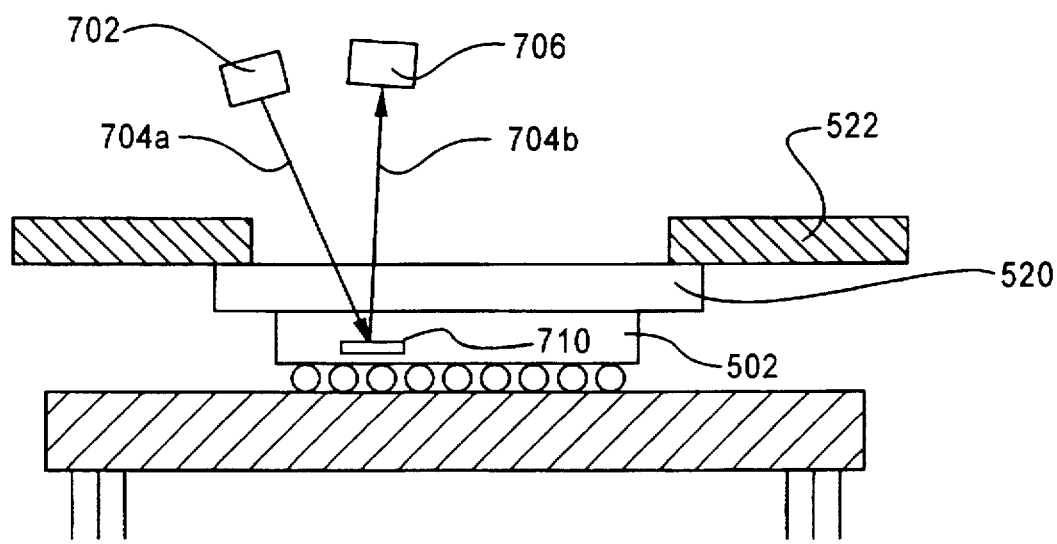
FIG. 7A illustrates a method for testing an integrated circuit device in accordance with one embodiment of the present invention.

Turning now to FIG. 7A, the integrated circuit device 502 of FIG. 5A is shown being probed by a laser beam 704a. Probing of integrated circuit 502 is achieved by positioning a laser 702 above integrated circuit device 502 and directing a laser beam 704a through heat slug 520 and onto a portion 710 of the Integrated circuit. A reflected laser beam 704b is produced as laser beam 704a is reflected from a metal contact or metal layer in the circuit. A detector 706 then measures reflected laser beam 704b. In one embodiment of the present invention, the phase shift between laser beam 704a and 704b is measured to determine the voltage at an integrated circuit P-N junction. It is appreciated that the laser probing apparatus of FIG. 7A is only exemplary of one of many laser probing configurations that may be used in the implementation of the present invention.

Figure 7B:
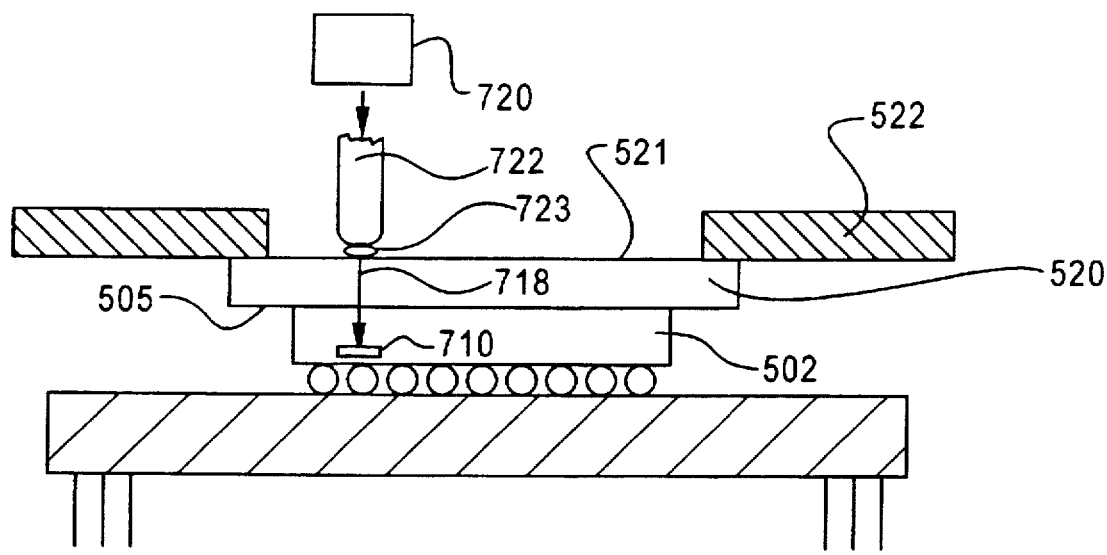
FIG. 7B illustrates a method for testing an integrated circuit device in accordance with another embodiment of the present invention.
Figure 7C:
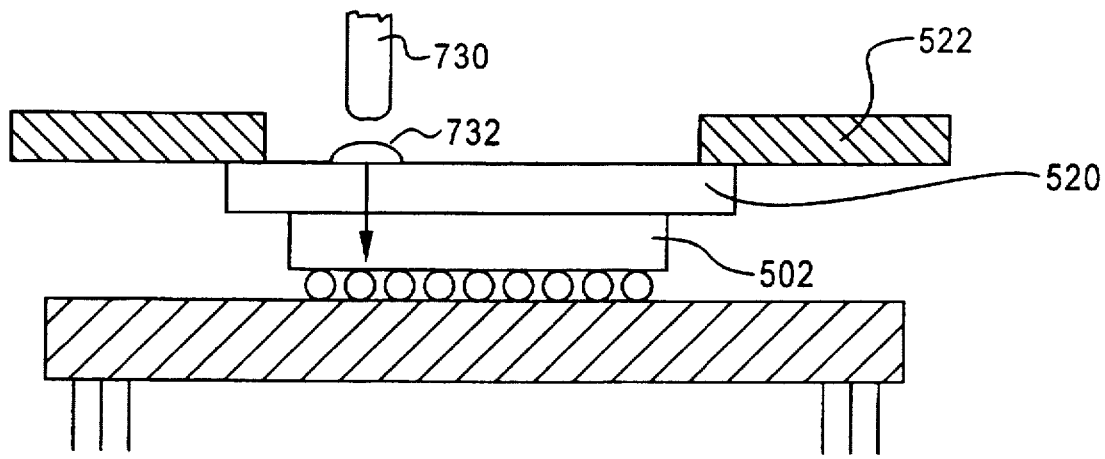
FIG. 7C illustrates a method for testing an integrated circuit device in accordance with yet another embodiment of the present invention.

In order to reduce the diffraction limit spot size of the infrared laser based optical system, one can use a liquid or solid immersion lens. In FIG. 7B, device 502 is shown being probed by an infrared laser microscope 720 having a oil immersion lens 722 that is in contact with the top surface 521 of heat slug 520 with a tiny drop of oil 723. Generally, in order for immersion lens 722 to work properly one must bring the lens in contact with the back side surface 505 of integrated circuit device 502. By placing lens 722 in physical contact with infrared transparent heat slug 520, the heat slug allows the lens to be in virtual contact with back side surface 505 of integrated circuit device 502. FIG. 7C shows device 520 being probed by an infrared microscope comprising an objective lens 730 and a solid immersion lens 732. The use of a solid immersion lens 732 requires that the lens be placed in contact, or near contact with the probed device. Heat slug 520 essentially raises the back side surface of the semiconductor substrate, making it more accessible to probing with immersion lens 722 and 732.

Figure 7D:
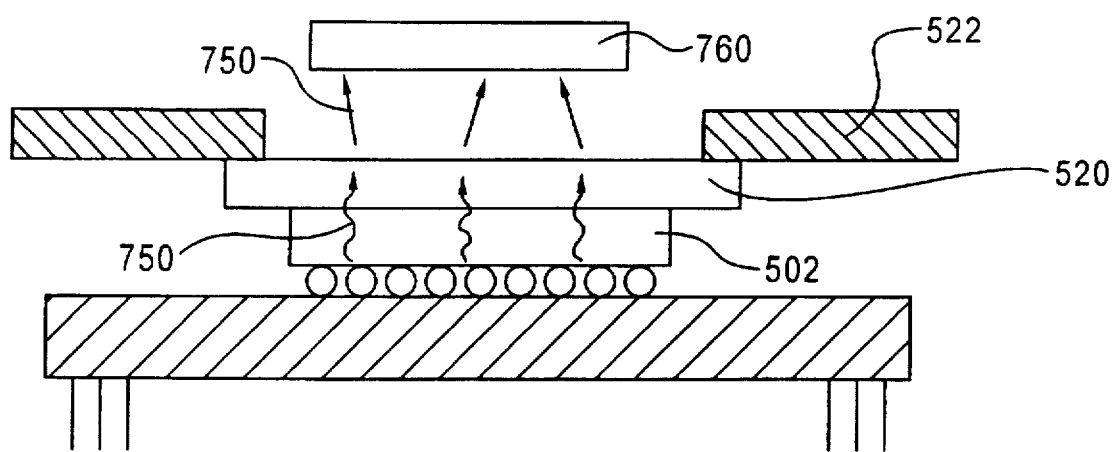
FIG. 7D illustrates a method for testing an integrated circuit device in accordance with another embodiment of the present invention.

As previously discussed, emissions from the back side of an integrated circuit may be measured to determine a variety of defects, such as, impact ionization, shorts, hot carrier effects, forward and reverse bias P-N junctions, transistors in saturation, and gate oxide breakdown. As illustrated in FIG. 7D, an infrared camera 760 may be positioned above integrated circuit device 502 to detect photon emissions 750 emanating through the back side surface 505 of the device. In accordance with the present invention, infrared transparent heat slug 520 is used to cool integrated circuit device 502 as photons 750 are being emitted from the operating device. In addition to providing a path for heat to escape from the back side surface 505 of integrated circuit device 502, heat slug 520 provides a free flow path between back side surface 505 and camera 760 for photons being emitted with a wavelength within the transmitted infrared spectrum.

In FIGS. 7A through 7D several optical-based testing methods have been described in terms of how they may be used in conjunction with a heat removal apparatus of the present invention. It is appreciated, however, that the present invention is not limited to any particular optical-based testing method, nor is it limited to the testing of any particular type of semiconductor device. For example, in the apparatus of FIG. 7D, infrared camera 760 may be used to detect infrared radiation in order to thermal map the integrated circuit device.

Figure 8:
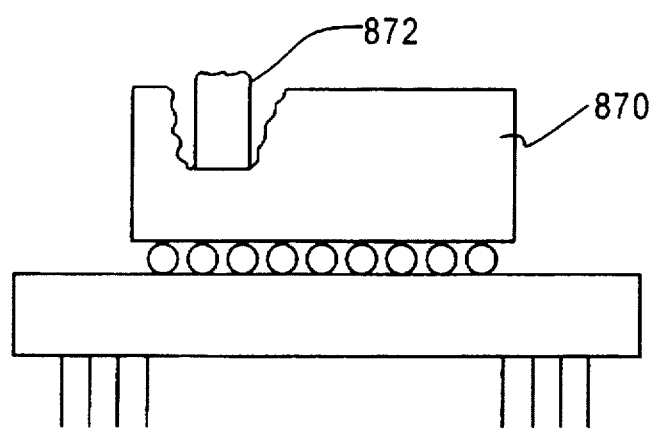
FIG. 8 illustrates another embodiment of the present invention with the back side of the semiconductor substrate being locally thinned.

Absorption losses through a silicon semiconductor substrate are exponentially a function of the substrate thickness. By thinning the substrate these absorption losses can be greatly reduced to enhance the transmission of light, photons and thermal radiation from the semiconductor substrate surface. In one embodiment, the semiconductor substrate is globally thinned and polished prior to the placing the infrared heat slug over the backside of the semiconductor device. In some instances it may not be necessary to test all portions of an integrated circuit. In such instances, a localized thinning of the substrate, rather than a global thinning, may be preferred. Accordingly, as depicted in FIG. 8, a semiconductor substrate 870 may be thinned only at points residing above the portion(s) of the integrated circuit to be tested, or otherwise probed. Thinning of the substrate may be accomplished by any of a variety of processes known in the art, such as etching, polishing, milling, etc. Once thinning is complete, an infrared transparent heat slug 872 may be placed within the thinned region of the substrate as depicted in FIG. 8.

In the foregoing discussion, the use of an infrared transparent cooling device has focused primarily on C4 packaged technology. Note, however, that the infrared transparent cooling apparatus of the present invention may be used to facilitate the optical-based testing on any type of semiconductor device in which access to the back side of the semiconductor is obtainable. As an example, the methodology of the present invention may be used to test integrated circuit devices that are integrally formed within a printed circuit board.

Figure 9A:
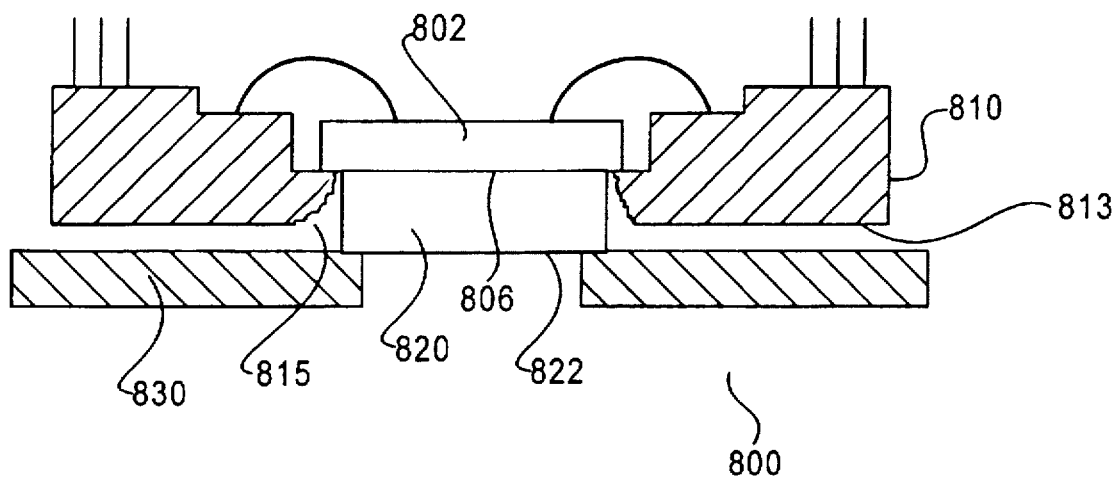
FIG. 9A illustrates a heat removal apparatus in yet another embodiment of the present invention.
Figure 9B:
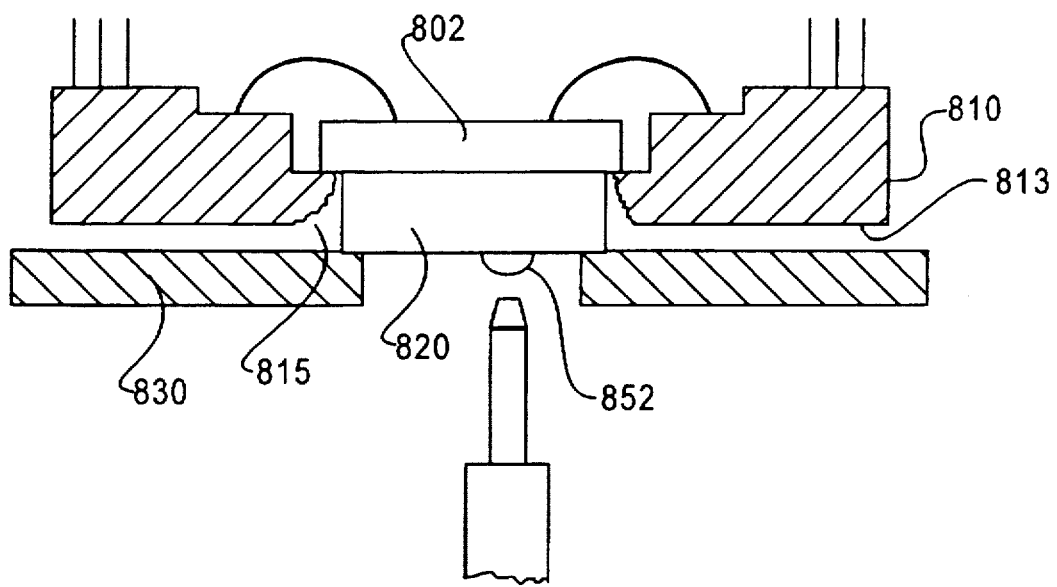
FIG. 9B illustrates how the heat removal apparatus of FIG. 8A may be used to facilitate the back side testing of the integrated circuit with an optical immersion lens.

As shown in FIG. 9A, the back side surface 806 of a wire bonded semiconductor device 802 may be accessed by removing a portion of the device package 810. The back side surface 806 of the semiconductor device 802 may be exposed by cutting, etching or milling away the bottom surface 813 of package 810. Once the back side surface 806 of device 802 is exposed, a heat removal apparatus 800 of the present invention is placed in thermal contact with back side surface 806. Heat removal apparatus 800 comprises an infrared transparent heat slug 820 and a heat sink 830 that is thermally coupled to the outer edges of the heat slug's top surface 822. A thermal grease (not shown) may be used at the heat slug 820 and heat sink 830 thermal interface and at the heat slug 820 and semiconductor device 802 thermal interface to enhance the flow of heat through apparatus 800. The thickness of heat slug 820 may be selected such that the top surface 822 of the heat slug protrudes above the bottom surface 813 of package 810. In this manner, heat sink 830 may be placed in thermal contact with the top surface 822 of heat slug 820 without any interference with the bottom surface 813 of package 810. Infrared transparent heat slug 820 also functions as an optical spacer to essentially raise the silicon back side surface 806 of device 802 above the bottom surface 813 of package 810. As a result, heat slug 820 permits the use of certain optical-based testing apparatus that would otherwise be prohibited by the existence of cavity 815. For example, an optical-based testing method that includes the use of an immersion lens requires that the lens be placed in direct optical contact with the back side of the integrated circuit device. Since the lens is relatively large in size, the existence of cavity 815 in package 810 will either limit the available area that may be probed, or prevent the use of the lens altogether. FIG. 9B illustrates the use of a solid immersion lens 852 to probe the back side of semiconductor device 802. This problem is overcome by the present invention since the thickness of the infrared transparent heat slug 820 may be selected to "virtually" raise the back side surface of semiconductor device 802 above the bottom surface 813 of package 810.

Figure 9C:
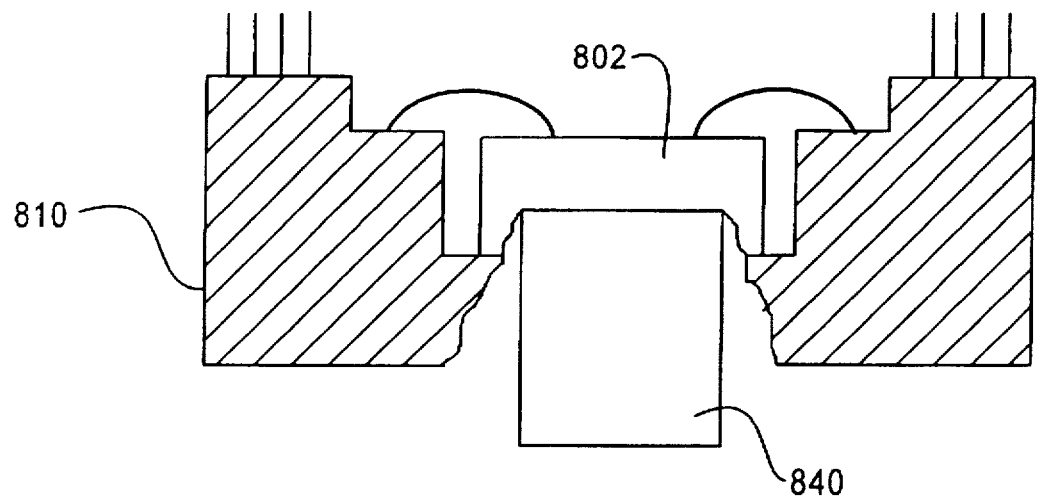
FIG. 9C illustrates another embodiment of the present invention wherein the back side of the semiconductor substrate has been thinned.

To further enhance the testing or probing of semiconductor device 802, semiconductor substrate may be globally or locally thinned as described above in conjunction with the C4 mounted semiconductor device of FIG. 8. As previously discussed, since absorption losses through the semiconductor are a function of the semiconductor thickness, absorption losses are reduced by thinning of the semiconductor substrate. In one embodiment, semiconductor device 802 is thinned and then polished to a smooth surface as shown in FIG. 9C. Once the back side of the semiconductor device has been thinned and polished an infrared transparent heat slug 840 may be placed within the thinned region of the device as depicted in FIG. 9C.

Figure 10:
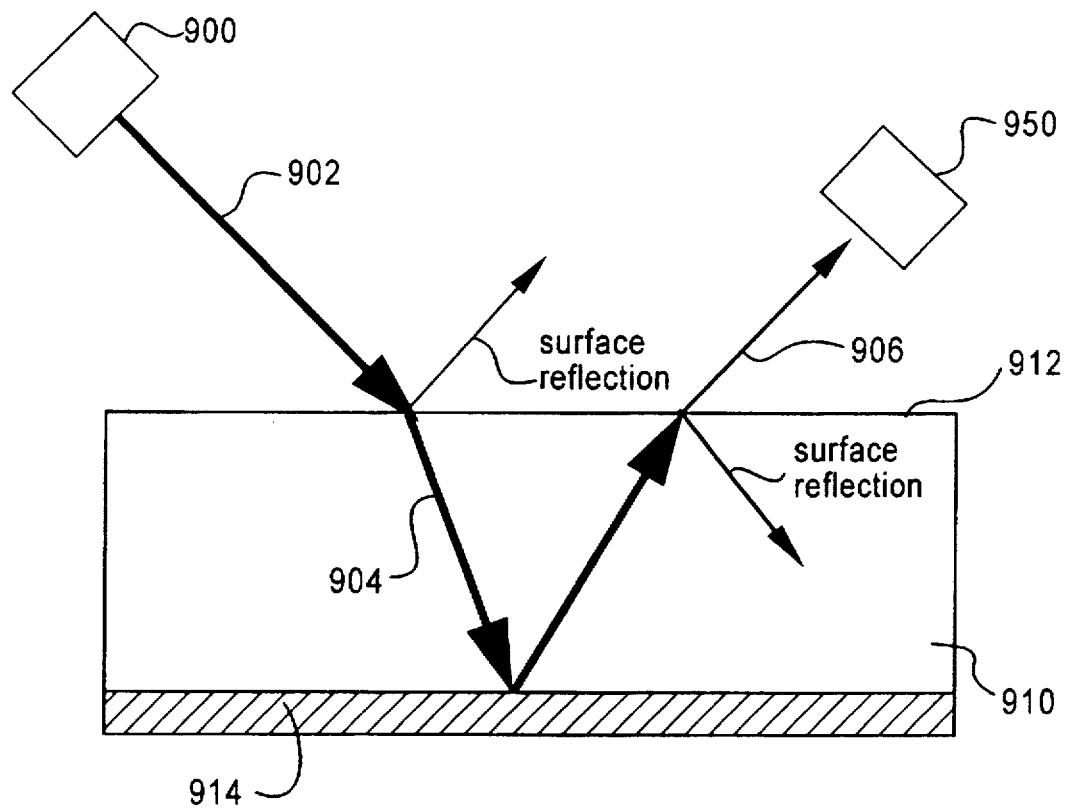
FIG. 10 shows the surface reflection of a laser beam as it passes through the surface of a semiconductor.

Due to high doping concentrations found in present day semiconductor devices, there exists a significant reduction in the transmission of energy traveling through the highly doped semiconductor substrate. Reflections at the semiconductor device back side surface also cause a significant reduction in the transmission of light through the back side of the semiconductor substrate. As shown in FIG. 10, the intensity of an incident beam 902 directed into a semiconductor substrate 910 by a laser 900 is reduced as the laser beam passes through the semiconductor back side surface 912. As shown in FIG. 10, a portion of the beam's energy 904 is directed into the substrate while another portion of the beam is reflected off the substrate's back side surface 912. In silicon, a laser beam having a wavelength of 1064 nanometers loses about a third of it's energy at a semiconductor-air interface due to reflection at surface 912. The transmitted beam 904 passes through silicon substrate 910 and is reflected off a metal contact or line 914 and back out the back side surface of the semiconductor substrate. About one third of the reflected energy 904 is lost as the beam passes through the back side surface 912 of the semiconductor substrate. The total energy of the transmitted beam 906 is less than half the intensity of the incident beam 902 (ignoring energy losses due to absorption and scattering effects). The substantial reduction in the laser beam energy makes it more difficult to detect and measure the reflected laser beam.

In the present invention, losses due to reflection will occur at both the integrated circuit device and heat slug interface and at the heat slug and air interface due to differences in the indices of refraction of the adjoining media at these interfaces. Since these reflections can represent a significant portion of the energy being transmitted, it may be desirable to coat the surfaces of the integrated circuit device and heat slug with an anti-reflective coating to reduce reflections at the boundary of the interfaces.

Figure 11A:
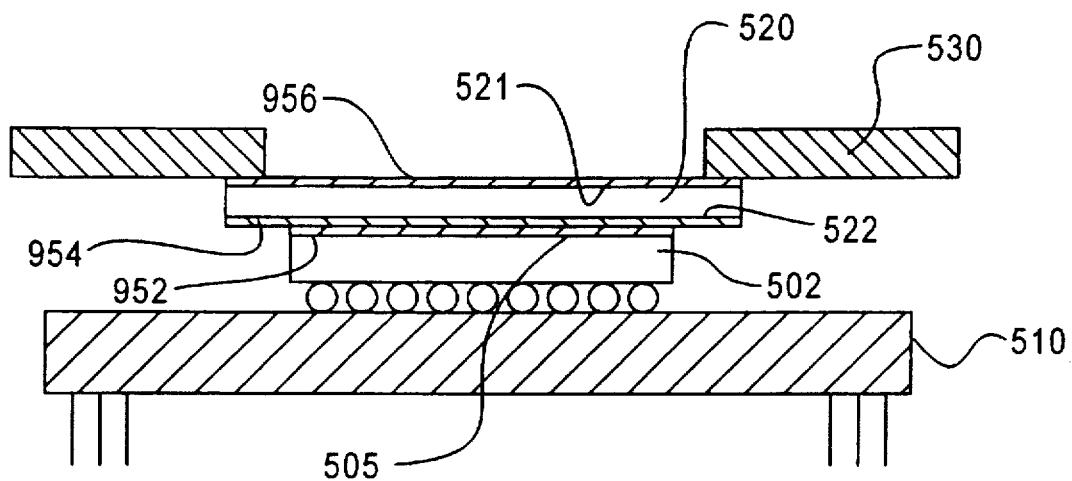
FIG. 11A illustrates a heat removal apparatus in another embodiment of the present invention wherein anti-reflective coatings are disposed over the surface of the infra-red heat slug and the back side surface of the semiconductor device.

FIG. 11A illustrates the apparatus of FIG. 5A having anti-reflective coatings 952, 954 and 956 deposited onto the back side surface 505 of integrated circuit device 502, and onto the top and bottom surfaces, 521 and 522, of heat slug 520, respectively. The anti-reflective coatings may be deposited onto their respective surfaces using a variety of known processes, such as evaporation, electron-beam deposition and sputtering. The method that is used to deposit anti-reflective coating 952 onto surface 505 should be chosen such that the process does not affect the performance of the fully packaged component. Each of anti-reflective coatings 952, 954 and 956 may comprise a single-layer anti-reflective coating, or a multiple layer anti-reflective coating.

Figure 11B:
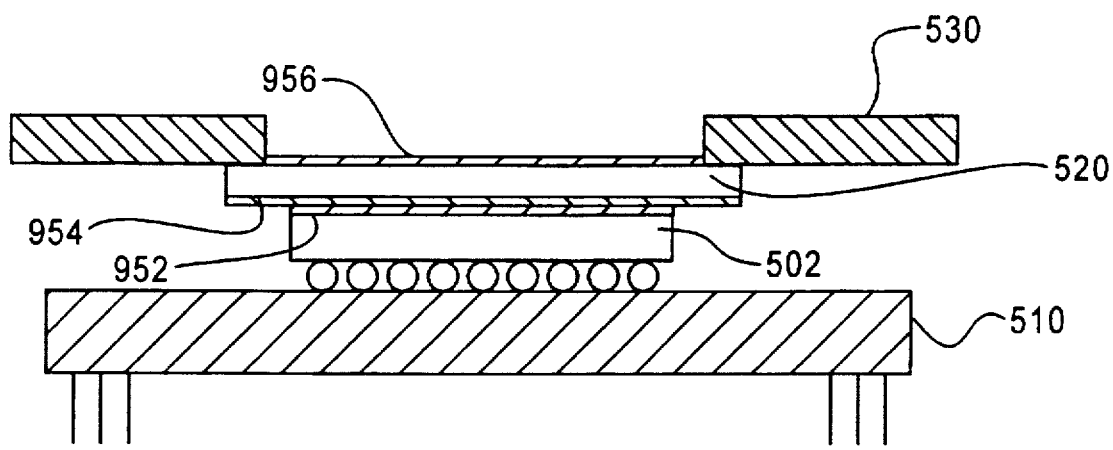
FIG. 11B illustrates the heat removal apparatus of FIG. 10A with the anti-reflective coating being removed from the outer edges of the top surface of the infrared transparent heat slug.
Figure 11C:
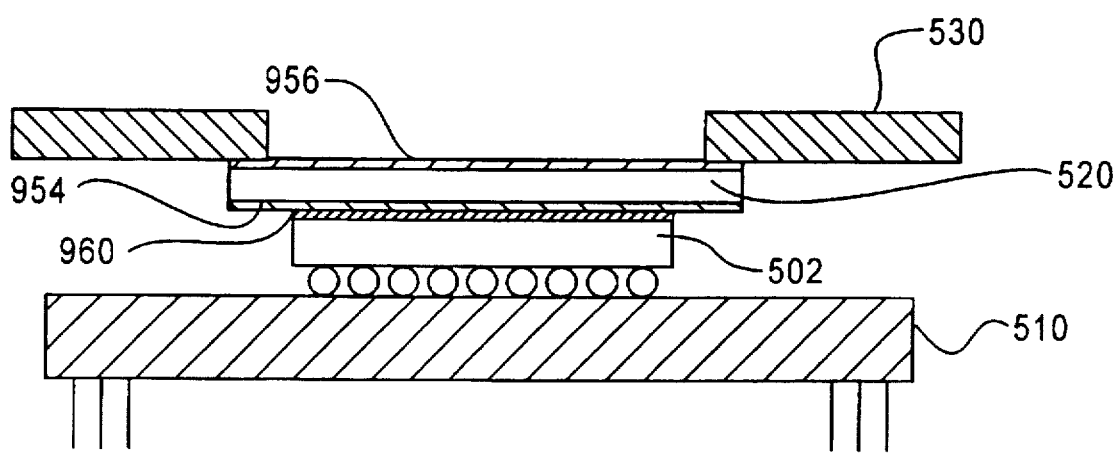
FIG. 11C illustrates a heat removal apparatus in another embodiment of the present invention wherein a thermal oil is disposed between the bottom surface of the infrared heat slug and the back side surface of the semiconductor device.

Since many anti-reflective materials have a low thermal conductivity, the application of such materials onto the surfaces of the semiconductor device 502 and heat slug 520 may affect the heat removal capability of the cooling apparatus 500. Although the anti-reflective film may be thin and not a significant concern, proper consideration must be given to the heat removal requirements of semiconductor device 502 when the use of anti-reflective coatings is contemplated. As illustrated in FIG. 11B, a portion of anti-reflective coating 956 may be removed from the outer edges of heat slug surface 520 in order to enhance the transfer of heat between heat slug 520 and the heat sink 530. In yet another embodiment of the present invention, an infrared transparent thermal oil 960 may be deposited onto the back side surface 505 of device 502 in lieu of depositing an anti-reflective film. (See FIG. 11C.)

As previously discussed above, it is often preferable to thin the back side of a semiconductor substrate in order to reduce losses due to absorption through the semiconductor. FIGS. 8 and 9C illustrate a C4 and wire bonded device, respectively, wherein the back side of the semiconductor devices have been thinned prior to the placement of the infrared transparent heat slug. To further enhance the optical based testing of these devices, an anti-reflective coating may first be deposited onto the thinned back side surface before the infrared heat slug is placed on top of the back side surface.

Thus, what has been described is an apparatus and method for removing heat from the back side surface of a semiconductor device while the back side of the device is being optically probed, or otherwise tested in accordance with an optical-based technique. In the foregoing detailed description, the methods and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. An apparatus comprising:
    a C4 mounted semiconductor device having a backside surface;
    an infrared transparent heat slug having a bottom surface and a top surface, said bottom surface being in contact with said backside surface of said semiconductor device; and
    a heat sink thermally coupled to said heat slug.

2. The apparatus of claim 1 wherein said heat slug comprises diamond.

3. The apparatus of claim 1 wherein said heat slug comprises silicon.

4. The apparatus of claim 1 wherein said heat slug comprises germanium.

5. The apparatus of claim 1 wherein said heat slug comprises gallium arsenide.

6. The apparatus of claim 1 wherein said heat sink comprises a thermally conductive plate having a through opening, said through opening being disposed over at least a portion of said semiconductor device.

7. The apparatus of claim 1 wherein said top surface of said heart slug is at least partially covered with an anti-reflective coating.

8. The apparatus of claim 1 wherein each of said top surface and said bottom surface of said heat slug is at least partially covered with an anti-reflective coating.

9. The apparatus of claim 1 wherein said backside surface of said semiconductor device is coated with an anti-reflective film.

10. The apparatus of claim 1 wherein an infrared transparent thermal grease is disposed between said bottom surface of said heat slug and said backside surface of said semiconductor device.

11. The apparatus of claim 1 wherein a thermal grease is disposed between the outer edges of said heat slug and the bottom surface of said heat sink.

12. An apparatus for cooling a backside surface of a semiconductor device that is attached to a substrate having an element, said semiconductor device extending above said substrate at a first height, said element extending above said substrate at a second height, said second height being greater than said first height, said apparatus comprising:
    an infrared transparent heat slug of a third height having a top surface and a bottom surface, said heat slug being disposed over said backside surface of said semiconductor device such that a thermal conduction path is provided between said backside surface of said semiconductor device and said bottom surface of said heat slug, the combination of said first and third heights extending above said substrate being greater than said second height; and
    a heat sink thermally coupled to said heat slug.

13. The apparatus of claim 12 wherein said heat slug comprises diamond.

14. The apparatus of claim 12 wherein said heat sink comprises a thermally conductive plate having a through opening, said through opening being disposed over at least a portion of said semiconductor device.

15. The apparatus of claim 12 wherein said top surface of said heat slug is covered with an anti-reflective coating.

16. The apparatus of claim 12 wherein each of said top surface and said bottom surface of said heat slug is covered with an anti-reflective coating.

17. The apparatus of claim 12 wherein said surface of said semiconductor device is coated with an anti-reflective film.

18. The apparatus of claim 12 wherein an infrared transparent thermal grease is disposed between said bottom surface of said heat slug and said surface of said semiconductor device.

19. An apparatus comprising:

a C4 mounted semiconductor device having a backside surface; and an infrared transparent heat slug having a bottom surface and a top surface, said bottom surface being in contact with said backside surface of said semiconductor device.

20. The apparatus of claim 19 further comprising a heatsink thermally coupled to said heat slug.

21. The apparatus of claim 19 wherein said heat slug comprises diamond.

22. The apparatus of claim 19 wherein said heat slug comprises silicon.

23. The apparatus of claim 19 wherein said heat slug comprises germanium.

24. The apparatus of claim 20 wherein said heat sink comprises a thermally conductive plate having a through opening, said through opening being disposed over at least a portion of said semiconductor device.

25. The apparatus of claim 19 wherein said top surface of said heat slug is at least partially covered with an anti-reflective coating.

26. The apparatus of claim 19 wherein each of said top surface and said bottom surface of said heat slug is at least partially covered with an anti-reflective coating.

27. The apparatus of claim 19 wherein said backside surface of said semiconductor device is coated with an anti-reflective film.

28. The apparatus of claim 19 wherein an infrared transparent thermal grease is disposed between said bottom surface of said heat slug and said backside surface of said semiconductor device.

29. The apparatus of claim 20 wherein a thermal grease is disposed between the outer edges of said heat slug and the bottom surface of said heat sink.

* * * * *

UNITED STATES PATENT AND TRADEMARK OFFICE
CERTIFICATE OF CORRECTION

PATENT NO. : 5,895,972
DATED : April 20, 1999
INVENTOR(S) : Paniccia

It is certified that error appears in the above-identified patent and that said Letters Patent is hereby corrected as shown below:

Column 3,
Line 7, delete "now" and insert -- not --.

Column 9,
Line 46, delete "the".

Signed and Sealed this

Twenty-fifth Day of November, 2003

JAMES E. ROGAN
*Director of the United States Patent and Trademark Office*